United States Patent
Shaji Lal (12)

(10) Patent No.: US 10,345,378 B2
(45) Date of Patent: Jul. 9, 2019

(54) APPARATUS AND METHOD FOR PERFORMING A SCALABILITY CHECK ON A HARDWARE DESCRIPTION LANGUAGE REPRESENTATION OF A CIRCUIT

(71) Applicant: ARM LIMITED, Cambridge (GB)

(72) Inventor: Rakesh Shaji Lal, Austin, TX (US)

(73) Assignee: ARM Limited, Cambridge (GB)

( * ) Notice: Subject to any disclaimer, the term of this patent is extended or adjusted under 35 U.S.C. 154(b) by 8 days.

(21) Appl. No.: 15/682,931

(22) Filed: Aug. 22, 2017

(65) Prior Publication Data

US 2019/0064269 A1    Feb. 28, 2019

(51) Int. Cl.
   *G01R 31/28*    (2006.01)
   *G01R 31/3183*    (2006.01)
   *G01R 31/317*    (2006.01)

(52) U.S. Cl.
   CPC .... *G01R 31/318364* (2013.01); *G01R 31/2815* (2013.01); *G01R 31/31704* (2013.01); *G01R 31/31835* (2013.01)

(58) Field of Classification Search
   CPC .. G06F 17/5045; G06F 2217/68; H04L 69/22; G01R 31/318364; G01R 31/2815; G01R 31/31704; G01R 31/31835
   See application file for complete search history.

*Primary Examiner* — Guerrier Merant
(74) *Attorney, Agent, or Firm* — Nixon & Vanderhye P.C.

(57) ABSTRACT

A computer implemented method, and an apparatus, are provided for performing a scalability check on a Hardware Description Language (HDL) representation of a circuit. The HDL representation identifies a plurality of sink signals, where each sink signal is arranged to take a result value computed by performing an operation using as input one or more driver signals. The method comprises creating within a storage a mapping table to map drivers signals to sink signals, where each entry identifies a sink signal and an associated sink width indication, identifies each driver signal used in the computation of the result value for that sink signal along with an associated driver width indication for each driver signal, and an operation type indication for the operation used to compute the result value for the sink signal. A scalability check operation is then executed on processing circuitry for one or more selected entries in the mapping table that have at least one of the sink and driver width indications specified with reference to at least one parameter. The scalability check operation comprises determining, using the operation type indication and the driver width indication for each driver signal, a driver signal identifying an expected width for the sink signal, and determining using the sink width indication a sink formula to identify the width of the sink signal. The sink formula and the driver formula are then evaluated to determine whether the presence of the at least one parameter gives rise to a scalability issue. A result file is then output identifying each sink signal that has been detected to have a scalability issue.

18 Claims, 10 Drawing Sheets

RTL LEVEL REPRESENTATION

MAP OF DRIVERS FOR EACH SINK

| SINK ID | LINE NUMBER | SINK WIDTH | DRIVER ID | DRIVER WIDTH | OPERATION TYPE |
|---|---|---|---|---|---|
| SINK 1 | | | DRIVER 1<br>DRIVER 2 | | |
| ⋮ | ⋮ | ⋮ | ⋮ | ⋮ | ⋮ |
| | | | | | |

EXAMPLE SINK SIGNAL DEFINITIONS (1) LINE X   assign sink1 [PARAM1:0] = {2'b00, driver1 [PARAM2:0]};

(2) LINE Y   assign sink2 [PARAM1:0] = driver2 [PARAM1:0] + driver3$\left[\left(\frac{PARAM2}{PARAM3}\right):0\right]$;

(3)          always@*
             begin
    LINE Z       sink3 [PARAM1:0] = {2'b00, driver4 [PARAM2:0]} - driver5 [PARAM3:0];
             end

MAPPING TABLE                                                          160

| | SINK ID | LINE NUMBER | SINK WIDTH | DRIVER ID | DRIVER WIDTH | OPERATION TYPE | |
|---|---|---|---|---|---|---|---|
| (1) | Sink 1 | X | PARAM1+1 | CONSTANT driver1 | 2 PARAM2+1 | CONCATENATION | 170 |
| (2) | Sink 2 | Y | PARAM1+1 | driver2 driver3 | PARAM1+1 $\frac{PARAM2}{PARAM3}$+1 | ADDITION DIVISION | 180 |
| (3) | Sink 3 | Z | PARAM1+1 | CONSTANT driver4 driver5 | 2 PARAM2+1 PARAM3+1 | CONCATENATION SUBTRACTION | 190 |
| | | | | | | | |

FIG. 5

APPARATUS AND METHOD FOR PERFORMING A SCALABILITY CHECK ON A HARDWARE DESCRIPTION LANGUAGE REPRESENTATION OF A CIRCUIT

BACKGROUND

The present technique relates to an apparatus and method for performing a scalability check on a hardware description language (HDL) representation of a hardware circuit.

When designing hardware circuits, for example integrated circuits, it is known as an initial step to create a high-level representation of the hardware circuit in software form, using a hardware description language such as Verilog or VHDL. There are various levels of abstraction that can be used at this stage, but a common level of abstraction is the Register Transfer Level (RTL) abstraction, which can be used to represent a synchronous digital circuit in terms of registers and combinational logic, thus modelling the flow of digital signals between registers, along with the logical operations performed on those signals. The width of various signals can be expressed within the HDL representation of the circuit, and in some instances the width may be expressed in terms of at least one parameter, rather than being expressed as a constant value.

Whilst it is known to perform certain verification checks on the high-level representation of a digital circuit expressed in HDL form, those checks typically concentrate on checking that the HDL representation is syntactically correct. As part of the verification process, default values may be given to the various parameters specified within the HDL design. However, such verification processes cannot verify that the design will be scalable, i.e. whether if values of certain parameters are changed, the design will still operate as intended. It would accordingly be desirable to provide a mechanism that allowed for efficient and robust verification of the scalability of an HDL representation of a circuit.

SUMMARY

In a first example configuration, there is provided a computer implemented method of performing a scalability check on a Hardware Description Language (HDL) representation of a circuit, the HDL representation identifying a plurality of sink signals, where each sink signal is arranged to take a result value computed by performing an operation using as input one or more driver signals, the method comprising: creating within a storage a mapping table to map driver signals to sink signals, each entry in the mapping table identifying one of the plurality of sink signals and each driver signal used in the computation of the result value for that sink signal; for each entry of the mapping table, deriving from the HDL representation and storing within that entry a sink width indication of the sink signal, a driver width indication for each driver signal identified by that entry, and an operation type indication for the operation used to compute the result value for the sink signal; executing on processing circuitry a scalability check operation for one or more selected entries in the mapping table that have at least one of the sink and driver width indications specified with reference to at least one parameter, for each selected entry the scalability check operation comprising: determining, using the operation type indication and the driver width indication for each driver signal identified by the selected entry, a driver formula identifying an expected width for the sink signal; determining, using the sink width indication, a sink formula to identify the width of the sink signal; and performing an evaluation of the sink formula and the driver formula to determine whether the presence of said at least one parameter gives rise to a scalability issue; and outputting a result file identifying each sink signal that has been detected to have a scalability issue.

In another example configuration, there is provided an apparatus comprising processing circuitry to perform data processing operations; and storage to store data manipulated by the processing circuitry when performing the data processing operations; the apparatus being configured to execute a computer implemented method of performing a scalability check on a Hardware Description Language (HDL) representation of a circuit, in accordance with the first example configuration above.

In a further example configuration, there is provided a computer program comprising program instructions which, when executed on a computer, causes the computer to implement a method of performing a scalability check on a Hardware Description Language (HDL) representation of a circuit, in accordance with the first example configuration above. The computer program may be stored on a computer-readable storage medium, which may be a non-transitory medium.

BRIEF DESCRIPTION OF THE DRAWINGS

The present technique will be described further, by way of example only, with reference to embodiments thereof as illustrated in the accompanying drawings, in which:

FIG. 5 illustrates the content of the mapping table for some example sink equations;

DESCRIPTION OF EMBODIMENTS

Figure 1:
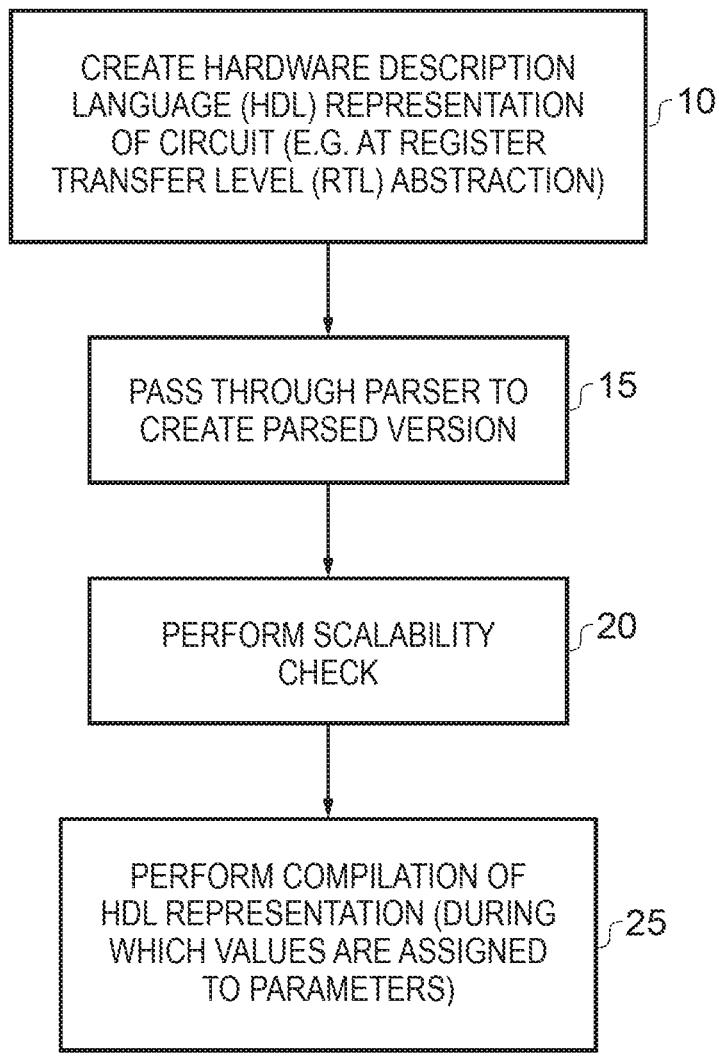
FIG. 1 is a flow diagram illustrating steps performed in accordance with one embodiment when producing an HDL representation of a circuit.

Before discussing the embodiments with reference to the accompanying figures, the following description of embodiments is provided.

In one example arrangement, a computer implemented method is provided for performing a scalability check on an HDL representation of a circuit. The HDL representation identifies a plurality of sink signals, where each sink signal is arranged to take a result value computed by performing an operation using as input one or more driver signals. The method comprises creating within a storage a mapping table to map driver signals to sink signals. Each entry in the mapping table is arranged to identify one of the sink signals and each driver signal used in the computation of the result value for that sink signal. Further, within each entry of the mapping table, width and operation type information is also captured. In particular, each entry stores, as derived from the HDL representation, a sink width indication of the sink signal, a driver width indication for each driver signal identified by that entry, and an operation type indication for the operation used to compute the result value for the sink signal. The operation type indication can take a variety of forms, but is sufficient to enable determination as to how the width of the sink signal will be influenced by the width of its driver signal(s).

For one or more selected entries in the mapping table that have at least one of the sink and driver width indications specified with reference to at least one parameter, a scalability check is then executed on processing circuitry. The scalability check operation comprises determining, using the operation type indication and the driver width indication for each driver signal identified by the selected entry, a driver formula identifying an expected width for the sink signal. Further, using the sink width indication, a sink formula is determined to identify the width of the sink signal. An evaluation is then performed of the sink formula and the driver formula to determine whether the presence of said at least one parameter gives rise to a scalability issue. A result file can then be output identifying each sink signal that has been detected to have a scalability issue.

Such an approach provides an automated test for robustly verifying the scalability of an HDL design of a circuit. Through the creation of the mapping table and the above described analysis performed on the entries of the mapping table, situations can readily be detected where parameterised widths of driver signals or sink signals may give rise to a scalability issue.

During known verification checks on an HDL representation, parameters would normally be given default values and syntactic correctness of the HDL representation would then be checked. However, such an approach will not enable an assessment of scalability to be made. Whilst one or more of the default values could be changed and the verification check re-performed, in order to seek to gain a measure of reassurance with regards to the scalability of the design, it will be appreciated that such an approach will only check certain specific configurations, and cannot provide robust verification for scalability. In contrast, by use of the above described technique where, for each selected sink signal, a sink formula and a driver formula are determined and an evaluation then performed on the sink formula and the driver formula, this provides a robust mechanism for detecting any scalability issues. During this process, there is no need to allocate any particular values to any of the parameters, and instead the parameters themselves can be incorporated within the driver formula and/or the sink formula. This enables situations where the use of parameters will give rise to scalability issues to be readily detected.

Whilst the sink formula and the driver formula may both be expressed in terms of one or more parameters, at least one of the sink formula and the driver formula may not include any parameters, and instead may reduce to a particular value.

The evaluation performed on the sink formula and the driver formula can take a variety of forms, and may depend on the extent to which parameters are used. For example, in one embodiment, when said at least one parameter is only present in one of the driver formula and the sink formula, said evaluation of the sink formula and the driver formula determines that a scalability issue exists. In particular, if one of the sink formula and the driver formula is expressed in terms of constant values, whilst the other formula includes at least one parameter, it will be appreciated that this inherently indicates a scalability problem, since the sink formula and the driver formula will not be able to match each other as the value of the at least one parameter is changed.

In one embodiment, when both the sink formula and the driver formula incorporate at least one of said at least one parameter, and a specified criteria is met, said evaluation comprises performing a string match evaluation of the sink formula and the driver formula to determine whether the sink formula and the driver formula match. In the absence of the sink formula and the driver formula matching, said evaluation determines that a scalability issue exists. Hence, in such an arrangement, by performing a string match evaluation, it can be determined whether the sink formula and the driver formula match without allocating any particular values to each parameter. If the string match evaluation determines that the sink formula and the driver formula are the same when expressed in their parameterised form, then this indicates that there is no scalability problem. However, if they do not match, this indicates that a scalability issue exists.

The specified criteria that needs to be met in order for the string match evaluation to be performed can take a variety of forms, but in one embodiment the specified criteria is that the driver formula and the sink formula comprise only one or more of addition, subtraction and multiplication operations.

In one embodiment, if the specified criteria is not met, for example because either the driver formula or the sink formula uses other operations, for example divide operations, then in one embodiment it is determined that it is not possible to readily identify with certainty whether a scalability problem exists or not. However, the likelihood of a scalability problem existing or not can still be checked. In particular, in one embodiment, in the absence of said specified criteria being met, said evaluation comprises determining whether either one of the driver formula and the sink formula use a parameter unused by the other one of the driver formula and the sink formula, and in that event to determine that a scalability issue exists. In contrast, if both the driver formula and the sink formula use the same parameters, it can be decided to treat this situation as being scalable.

There are a number of ways in which the mapping table may be created. For example, the process may be arranged to only generate the mapping table for a certain subset of the sink signals within the HDL representation. However, in one embodiment, the step of creating the mapping table comprises populating an entry of the mapping table for each sink of said plurality of sinks.

The selected entries in the mapping table that are chosen to be subjected to the scalability check may be chosen in a variety of ways. For example, additional information may be input so as to cause certain of the entries in the mapping table to be omitted from the scalability check, one example of such information being a waiver file that will be discussed in more detail later. However, in an alternative embodiment, the scalability check operation may be performed for every entry in the mapping table.

In addition to performing the scalability check for entries that have at least one of the sink and driver width indications specified with reference to at least one parameter, in one embodiment the scalability check operation may also be performed for at least one selected entry where none of the sink and driver width indications are specified with reference to at least one parameter. In that latter event, the determining of the driver formula produces an expected width value and the determining of the sink formula produces an actual width value. The evaluation of the sink formula and the driver formula then detects whether the expected width value matches the actual width determined from the sink formula, with a syntactic error being detected when the expected width value and the actual width value differ. This provides a very efficient mechanism for evaluating sink signals with reference to a constructed mapping table, since both scalability issues and syntactic issues can be detected during the analysis.

In one embodiment, when populating the mapping table, the width of the driver signal can be taken from the specification of that driver signal at the point it is linked to the associated sink signal within the HDL representation. However, in an alternative embodiment, a more thorough review of the history of the driver signal within the HDL representation can be performed. In particular, in one embodiment, when deriving from the HDL representation the driver width indication for a driver signal of an associated sink signal, when a width of said driver signal is identified as a constant when linked to the associated sink signal within the HDL representation, the deriving step may comprise reviewing the HDL representation to determine whether an earlier definition of that driver signal expresses the width in terms of at least one parameter, and in that event to produce for storage in the associated entry of the mapping table the driver width indication in terms of said at least one parameter.

Hence, when the history indicates that the driver signal has in fact earlier been defined with reference to at least one parameter, that at least one parameter will be captured within the driver width indication stored within the mapping table. This provides for enhanced detection of scalability issues. By way of specific example, it may be that at the point of defining a sink signal within the HDL representation, both the sink signal and the associated one or more driver signals are expressed in terms of constant widths, which would imply that there is no scalability issue. However, if on an analysis of the HDL representation, it transpires that one of the driver signals was earlier defined in terms of a parameterised width, then by capturing the relevant parameter(s) within the mapping table, a scalability issue will in fact then be determined when performing the scalability check for the relevant entry in the mapping table.

In some embodiments, there may be some sections of the HDL representation that the designer may wish to exclude from the above scalability checks. In one embodiment, this is achieved through the use of a waiver file. In particular, the computer implemented method may further comprise receiving via an input interface a waiver file identifying sink signals to be omitted from the scalability check operation, and when executing on the processing circuitry a scalability check operation for one or more selected entries in the mapping table, the one or more selected entries are chosen so as to exclude any sink signal identified by the waiver file.

The waiver file can be formed in a variety of ways, but in one embodiment identifies the sink signals to be omitted by reference to a line number of each such sink signal within the HDL representation, and the mapping table includes for each entry an indication of the line number of the associated sink signal, such that a determination to omit from the scalability check operation a sink signal identified in an entry of the mapping table is determined by comparison of the line number indication stored in that entry with the line numbers identified in the waiver file. Hence, this provides an efficient mechanism for determining which mapping table entries should be omitted from the scalability check process.

It may be that the designer choses to alter the design of the circuit, during which process one or more additional lines may be added to the HDL representation and/or one or more lines may be omitted. As a result, the line numbering within the modified design may differ to the line numbering within the original design. Version control software may be used to record changes made between a current HDL representation of a circuit and a previous HDL representation of the same circuit, so as to enable line numbers in the previous HDL representation to be mapped to line numbers in the current HDL representation. In one embodiment, the availability of version control software to produce such information is used to enable an automatic update of the waiver file.

In particular, in one embodiment, when the waiver file is specified for said previous HDL representation, the method further comprises, prior to creating the mapping table and performing the scalability check operation in respect of the current HDL representation, obtaining an output from the version control software indicative of the changes made between the current HDL representation and the previous HDL representation, and updating the waiver file with reference to said output, so as to update the line number references within the waiver file to identify the line number within the current HDL representation for each sink signal to be omitted from the scalability check operation. By such an approach, this can remove from the designer the responsibility to update the waiver file every time a line of code is added or deleted in a particular HDL representation file.

There are a number of ways in which an output from the version control software may be obtained. In one embodiment, the version control software is "Git". Git is an open source tool for managing version control in computer files, and can be used to manage version control between different HDL design versions of a circuit. In such an embodiment, the output from the version control software can be obtained by issuing a Git diff command to the version control software, and the output comprises a file identifying where lines have been deleted from the previous HDL representation and where lines have been added to the previous HDL representation.

There are a number of ways in which the output from the version control software can be used to update the waiver file. In one embodiment, the update of the waiver file comprises analysing the output from the version control software to create a remapping table mapping line numbers in the previous HDL representation to line numbers in the current HDL representation, and for each entry in the waiver file updating the line number information using the remapping table.

There are a number of points at which the scalability check operation can be performed during the HDL design process. In one embodiment, the scalability check operation is performed on the HDL representation prior to the HDL representation being subjected to a compilation operation. Typically, it is only at the compilation operation stage that particular values are attributed to the parameters, and hence the scalability check operation can suitably be performed prior to the compilation operation before any values are attributed to the parameters. In one particular embodiment, the scalability check operation is incorporated during a parsing process performed on the HDL code.

The HDL representation can represent the circuit at a variety of different levels of abstraction, but in one embodiment represents the circuit of a Register Transfer Level (RTL) of abstraction. RTL is commonly used as a suitable level of abstraction when defining synchronous circuits, and the above described scalability check techniques can readily be applied in association with such RTL designs.

Particular embodiments will now be described with reference to the Figures.

FIG. 1 is a flow diagram illustrating steps that may be performed when producing an HDL representation of a hardware circuit. At step 10, the designer creates a representation of a circuit as a sequence of lines of code in an HDL, for example Verilog or VHDL. For synchronous circuits, this HDL representation will typically be at the Registered Transfer Level (RTL) of abstraction.

Thereafter, the HDL representation will be passed through a parser in order to create a parsed version of the HDL. As will be understood by those skilled in the art, the parsing of the HDL will create a version that is suitable to be compiled.

In one embodiment, once the parsed version of the HDL is created at step 15, a scalability check is performed at step 20, in particular looking at the widths of sink and driver signals to determine whether the parameterisation of any of those signals could give rise to scalability issues. A sink signal is arranged to take a result value computed by performing an operation using as input one or more driver signals. Hence, purely by way of example, within an RTL abstraction the driver signals may emanate from source registers and are then subjected to operations performed by combinational logic in order to produce a result value that is stored in a destination register, that result value forming the sink signal for those associated driver signals. Herein, each sink signal may also be referred to as a sink and each driver signal may also be referred to as a driver.

The scalability check may be performed as a standalone check after completion of the parsing operation, or in one embodiment may be incorporated into the parser functionality so as to enable the scalability check to be performed during the parsing process.

If any scalability issues are identified during performance of the scalability check, an output file can be generated to advise the designer of the scalability issues that have been detected. This may then result in the design being altered to seek to remove the scalability issues, with the altered design then being subjected to the parsing and scalability check processes of steps 15, 20.

Following the scalability check, the HDL representation can be subjected to a compilation operation at step 25 in order to produce a compiled HDL design for a specific instance of the design, that can then be forwarded to subsequent design stages. Certain verification checks are typically performed during the compilation stage by a suitable HDL compiler, including assigning values to all the parameters and making sure for those specific values of the parameters that all the different sinks and their corresponding drivers have consistent widths.

In accordance with one embodiment, step 25 may be deferred until the HDL design has passed the scalability check process of step 20, so that by the time the HDL representation is compiled, it is known that the design is scalable. This provides for a robust verification of the design. In particular, it is possible that the party that performs the compilation may be different to the party that designed the initial HDL representation. Whilst default values for the parameters may be provided by the designer for use with the HDL representation, a party performing the compilation may choose to alter one or more of those values, and in the past this has led to situations where scalability issues manifest themselves at the time the compilation process is performed. However, with the technique of the described embodiments herein, the performance of the scalability check at step 20 enables an efficient and robust verification of the scalability of the design, so that by the time the design is output for compilation, the scalability of the design is known.

This may for example lead to a design being provided where it is identified that certain parameters should not be changed, or alternatively, as mentioned earlier, the RTL representation may be amended as a result of the scalability check in order to seek to remove any scalability issues, so that a design can be provided for compilation that it is known is fully scalable. In that instance, it is known that any changes made to the default values for the parameters will not give rise to scalability issues.

Following compilation at step 25, the compiled HDL representation of the circuit can then be used during a number of further steps to produce the final layout design for the circuit. For example, an Electronic Design Automation (EDA) synthesis tool can be used to convert the HDL representation of the design into a gate level description (sometimes referred to as a netlist). Thereafter, place and route tools can be used to convert the netlist into a physical layout, for example with reference to standard cell libraries and the like. Once the physical layout design has been produced, then the hardware circuit can be manufactured in accordance with that physical layout.

Figure 2:
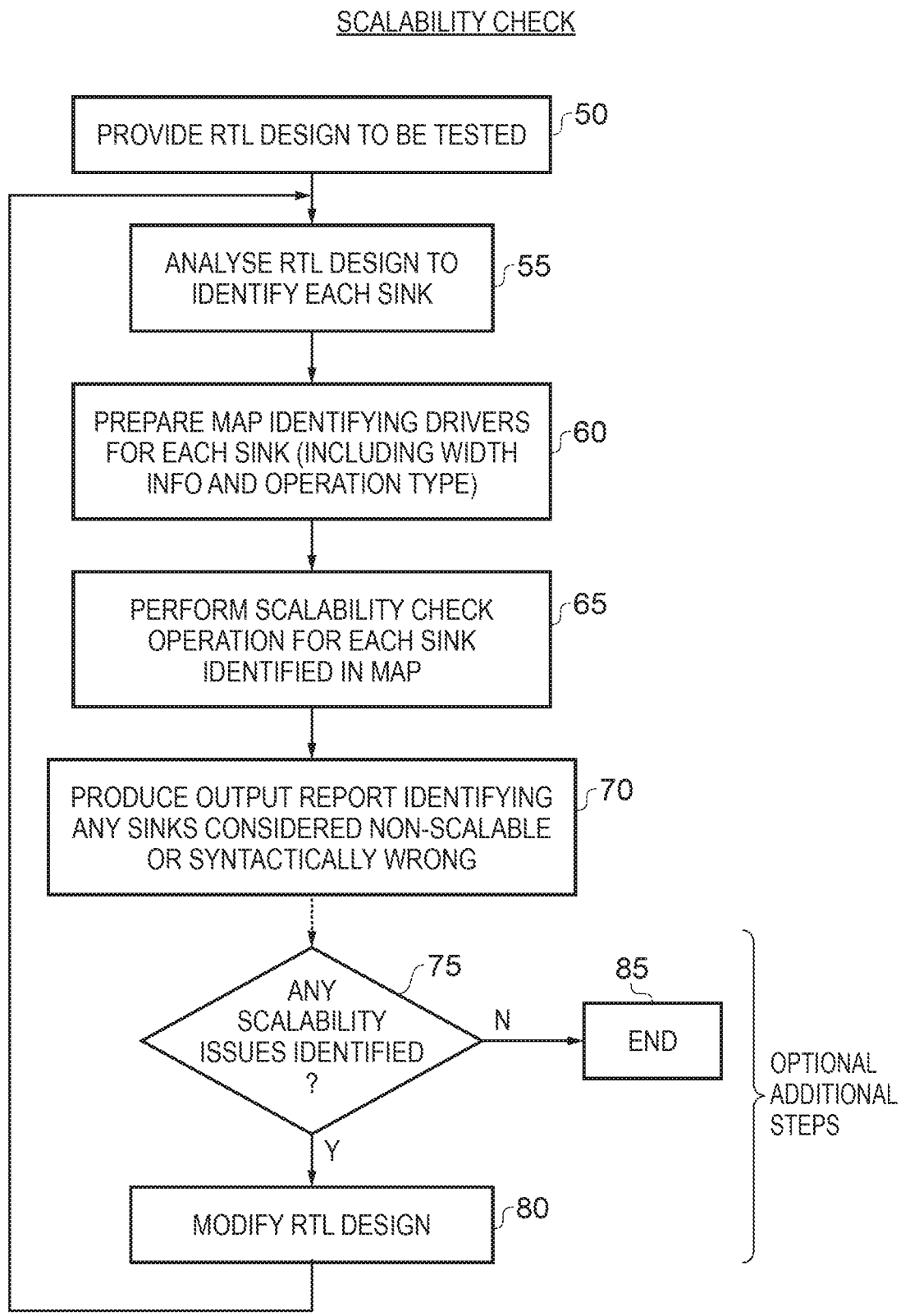
FIG. 2 is a flow diagram illustrating steps undertaken when performing the scalability check of FIG. 1 in accordance with one embodiment.

FIG. 2 is a flow diagram illustrating the scalability check process of step 20 of FIG. 1 in more detail. For this example, it is assumed that the HDL representation is at the RTL abstraction level. At step 50, the RTL design is provided, in one embodiment this being the parsed version created at step 15 of FIG. 1. Then, at step 55, the RTL design is analysed to identify each sink. In particular, the individual lines of code within the RTL design can be reviewed in order to identify lines that define sinks.

At step 60, a mapping table is prepared identifying the drivers for each sink, and as will be discussed in more detail later the information captured within the mapping table also identifies the width information for the drivers and the sinks, and an operation type indication providing an indication of the operation used to compute the value of the sink from the associated drivers. The operation type indication can take a variety of forms, but is sufficient to enable determination as to how the width of the sink signal will be influenced by the width of its driver signal(s).

Once the mapping table (also referred to herein as a map) has been prepared, then in one embodiment a scalability check is performed at step 65 for each sink identified in the map. This process will be discussed in more detail later with reference to FIG. 6, but in essence involves, for each sink, determining a driver formula identifying an expected width for that sink taking into account the driver width indications for each driver signal and the operation type indication, determining a sink formula to identify the width of the sink signal with regard to the sink width indication, and then evaluating the sink formula and the driver formula to determine whether the use of at least one parameter in the definition of the driver width and/or the sink width gives rise to a scalability issue.

Once the scalability check operation has been performed for each of the sinks identified in the map, or for a selected subset of the identified sinks if certain sinks are identified as to be omitted from the scalability check, then an output report is produced at step 70 identifying any sinks considered to be non-scalable or syntactically wrong. There are a number of ways in which the sinks can be identified in the output report, but in one embodiment the output report identifies at least the line number of the code that identifies each sink that has been determined to be non-scalable or syntactically wrong. In one embodiment, a sink ID is also provided in the output report in association with the line number.

Any syntactic errors will typically be corrected, and the process re-performed until a design has been produced that has no syntactic errors in it. With regards to information about sinks that are considered to be non-scalable, these can be treated in a number of ways. For example, it could be decided to output that information along with the design to the compilation process, so as to effectively identify parameters whose value should not be modified from default values provided with the design. However, in an alternative embodiment, the RTL design itself could be modified by the designer in order to seek to remove such scalability issues, with the modified design then being re-subjected to the parsing and scalability check operations of steps 15, 20 of FIG. 1. This process can potentially be performed iteratively until a design is arrived at that does not suffer from any scalability issues. This is illustrated schematically by steps 75, 80 and 85 in FIG. 2. In particular, when the output report at step 70 indicates any scalability issues at step 75, the RTL design is modified at step 80, and then the process returns to step 55. Once all scalability issues have been resolved, and accordingly it is determined at step 75 that there are no longer any scalability issues in the design, then the scalability check operation of step 20 is considered complete, and the process proceeds to step 85.

Figures 3, 4:
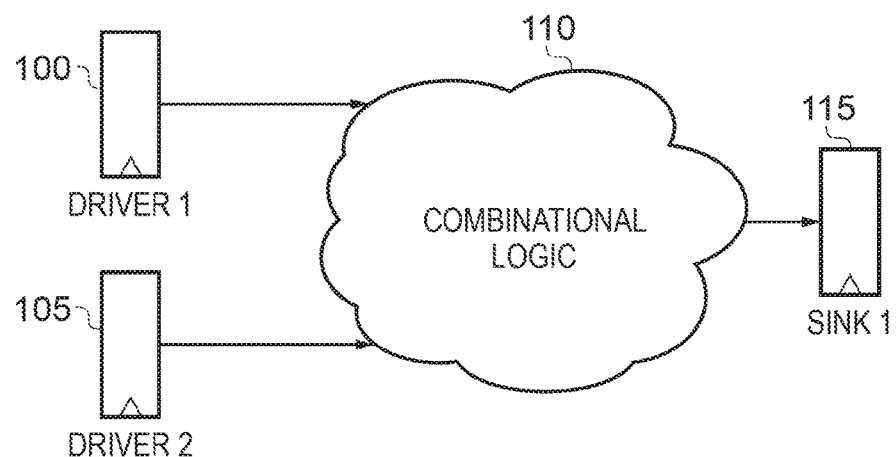
FIG. 3 schematically illustrates an RTL representation of a processing stage within an HDL representation of a circuit.
FIG. 4 is a table illustrating fields provided within a mapping table created during the scalability check in accordance with one embodiment, to provide a map of driver signals for each sink signal.

FIG. 3 is a diagram schematically illustrating an RTL representation of a processing stage within an RTL design, so as to illustrate a sink and its associated drivers. As mentioned earlier, an RTL design defines a synchronous circuit in terms of registers and associated combinational logic. In the example illustrated in FIG. 3, it is assumed that the registers 100, 105 provide two driver signals that are input to the combinational logic 110, which performs an operation using those drivers to produce a result value output to the register 115, the register 115 being considered to be the sink in this example. In the RTL design, it is possible to specify each of the drivers and the sink as having constant width values. However, it is also possible that the widths of the various drivers and sinks can be specified in terms of parameters, so that the widths can actually be varied dependent on values attributed to those parameters, for example at compilation time. With knowledge of each of the driver widths, and the type of operation performed by the combination logic 110, it is possible to determine an expected width of the sink signal. When at least one of the drivers has its width specified using at least one parameter, then it is possible to compute the expected width of the sink in terms of the specified parameters. Similarly, the actual sink width may be specified in terms of one or more parameters.

It will be appreciated that FIG. 3 merely shows one processing stage within an RTL design of a circuit. Accordingly, the sink 115 may itself form a driver for a subsequent processing stage. Similarly, either or both of the drivers 100, 105 may themselves be a sink for a preceding processing stage.

In accordance with the techniques described herein, a mechanism is provided for determining a driver formula representing the expected width of a sink signal, having regards to the driver widths and the operation performed by the combinational logic, and also to produce a sink formula to identify the actual sink width. It is then possible to evaluate the sink formula and the driver formula in order to identify situations where the use of at least one parameterised width gives rise to a scalability problem.

At a preliminary stage, as identified earlier with reference to FIG. 2, a mapping table is prepared to map driver signals to sink signals, and a number of fields are proceeded within each entry of the mapping table.

FIG. 4 is a table illustrating one example arrangement of the mapping table that may be used. In particular, each entry within the mapping table 120 may include the fields 125, 130, 135, 140, 145 and 150. Field 125 can be used to provide a sink ID to identify the sink to which that entry relates. A line number indication can then be provided within the field 130 to identify the line within the RTL code where the sink is defined. A sink width indication can then be provided within the field 135 used to determine the actual width of the sink signal. Depending on how the sink is defined, this may be a constant value, or may be expressed in terms of one or more parameters.

Field 140 is then used to identify each of the drivers used in the computation of the sink. Considering the example of FIG. 3, this will hence identify, for an entry relating to "sink 1", both of the drivers "driver 1" and "driver 2". Field 145 is then used to provide a driver width indication for each of the drivers. Again, each driver width may be expressed in terms of a constant, or using one or more parameters. Finally, an operation type field 150 can be used to identify the type of operation performed by the combinational logic, and hence how the drivers are combined when producing the sink.

FIG. 5 illustrates how the table may be populated for various specific examples of sink definitions. In accordance with the first example, the sink "sink 1" is defined with reference to "driver 1" and a constant value. As can be seen from the content of line X, the sink width is specified in terms of a parameter "PARAM1" and in particular it will be appreciated that the sink width is equal to PARAM1+1. Accordingly, the first entry 170 is populated to identify sink 1, identify that it is defined at line X and to identify the sink width as PARAM1+1. The driver ID field can then be used to identify the two drivers, namely the constant which has a driver width of 2 and driver 1 which has a width of PARAM2+1. The operation type field can then be used to identify that a concatenation operation is being performed such that the two drivers are concatenated together to produce the sink.

Entry 180 is used to capture the relevant information for sink 2, which is defined using the second equation shown in the upper half of FIG. 5. Here it can be seen that sink 2 is defined in terms of two drivers, and each of those drivers has its width defined in terms of a parameter. Further, sink 2 also has its width determined in terms of a parameter. The operation type within the entry 180 will identify that an addition operation is performed using the two drivers.

The entry 190 similarly captures the information derived for the sink "sink 3" shown as the third example in FIG. 5. The "always @*" construct identifies that whenever the value of driver 4 or driver 5 changes then the value of sink 3 is updated on the next clock edge. As can be seen from the entry 190, this captures information about the various drivers (in this case there are three drivers, namely driver 4, driver 5 and the two-bit constant), and information about the driver widths and sink width. It also identifies that the constant and driver 4 are subjected to a concatenation, with that intermediate result then being subjected to a subtraction operation using driver 5.

Figure 6:
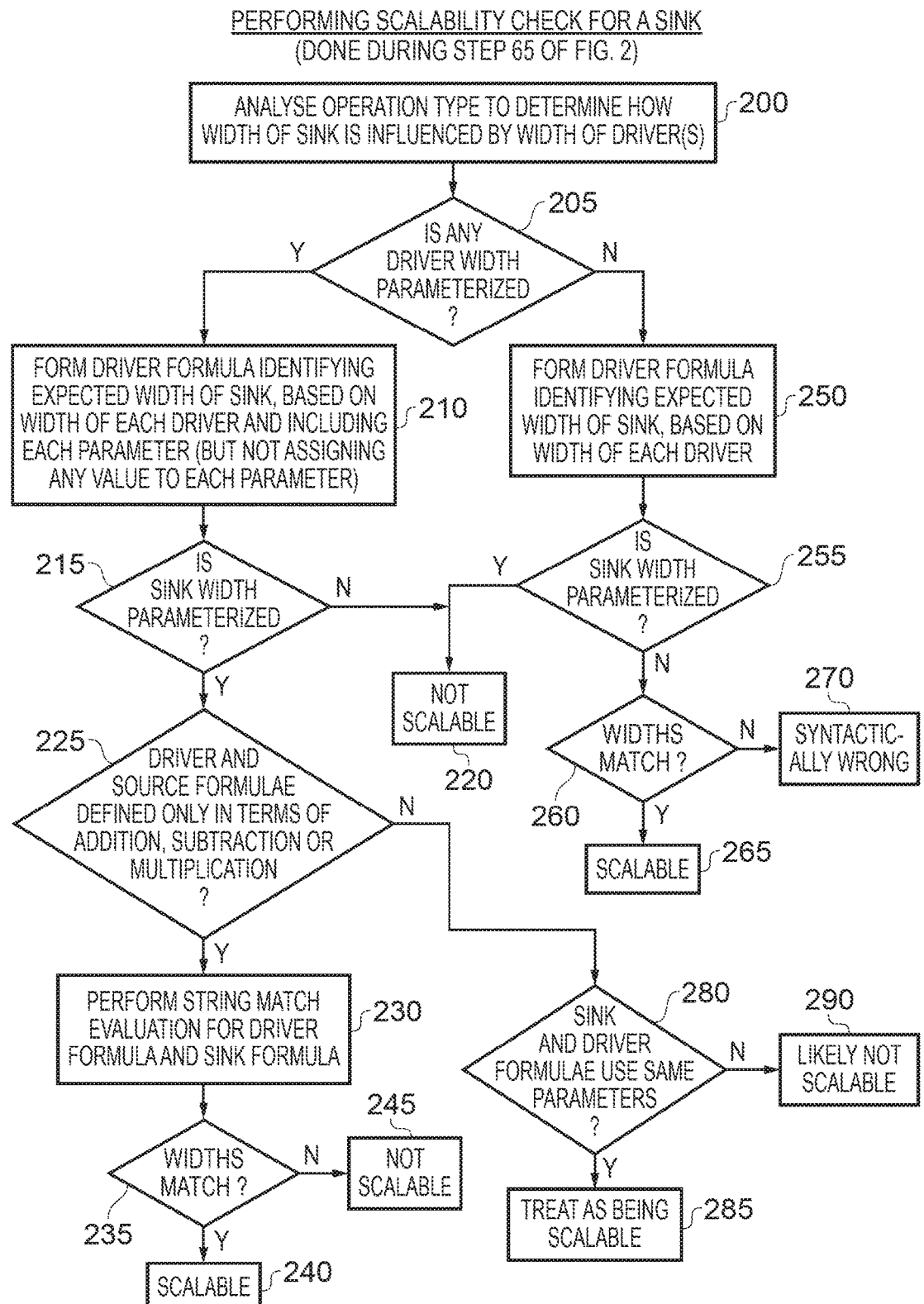
FIG. 6 is a flow diagram illustrating in detail the scalability check performed for a sink signal in accordance with one embodiment.

Using the information captured within the table 160, it is then possible to perform a scalability check for each sink identified in the mapping table. This scalability check process in accordance with one embodiment is illustrated in more detail by the flow diagram of FIG. 6. In particular, for each selected entry from the mapping table, the sequence of steps shown in FIG. 6 is performed. At step 300, the operation type information is analysed to determine how the width of the sink is influenced by the width of the driver or drivers used in the computation of the result value for that sink. At step 205, it is determined whether any driver width is parameterised. If so, then the process proceeds to step 210 where a driver formula is produced identifying the expected width of the sink, based on the width of each driver, and including each parameter. The driver formula also takes into account the operation type information analysed at step 200. It should be noted at this stage that no attempt is made to assign any particular value to each parameter, and instead the driver formula expresses the expected width in terms of the parameters.

At step 215, it is then determined if the sink width is parameterised. If it is not, then it is flagged at step 220 that the definition of the sink is not scalable. In particular, since the sink width itself is not expressed in terms of a parameter, but the expected width determined from the drivers is, this immediately indicates that there is a scalability issue, since it is clear that the actual sink width will not match the expected sink width for any possible value of the parameters used to identify the driver widths.

If at step 215 it is determined that the sink width is parameterised, then this means that both the source formula used to identify the width of the sink and the driver formula used to identify the expected width of the sink, are expressed in terms of parameters, and in this case the process proceeds to step 225 where it is determined whether both the driver and source formulae are defined only in terms of certain specific operations, in this particular example addition, subtraction or multiplication. When neither the driver nor the source formula use computations other than addition, subtraction or multiplication, then the process can proceed to step 230 where a string match evaluation is performed for the driver formula and the sink formula in order to determine whether both formulae identify matching widths in terms of the parameters. If the widths are determined to match at step 235, then the associated sink definition is assumed to be scalable at step 240, whereas otherwise it is considered not scalable at step 245.

If either or both of the driver and source formulae are defined in terms of operations other than addition, subtraction and multiplication (for example if the driver formula uses a division operation), then instead of proceeding to step 230 the process proceeds to step 280. In particular, when operations like division are used, it is decided that it is not readily determinable whether there is in fact in a scalability issue, but a general check of the sink and driver formula can be made in order to determine whether there is likely to be a scalability issue or not. In particular, at step 280 it is determined whether the sink and driver formula use the same parameters. If they do, then at step 280 it is determined that the sink definition should be treated as being scalable, whereas otherwise it is determined at step 290 that the sink definition is likely not scalable.

Returning to step 205, if it is determined that none of the driver widths are parameterised, then at step 250 the driver formula is determined in order to identify the expected width of the sink based on the width of each driver and the associated analysis of the operation type at step 200. In this situation, the determination of the driver formula actually produces an expected width value.

The process then proceeds to step 255, where it is determined whether the sink width is parameterised. If the sink width is parameterised, then this indicates that the design is not scalable at step 220, since if the sink width is parameterised, but none of the driver widths are, it is clear that the sink width will not match the expected width derived from the driver widths, for any value of the parameter.

However, assuming it is determined at step 255 that the sink width is also not parameterised, then determination of the sink formula will produce an actual width value, and at step 260 it can really be determined whether the expected width value determined from the driver formula at step 250 matches the actual width value determined from the sink formula. If the widths match, then the definition of the sink is considered to be scalable at step 265, whereas otherwise it is flagged that the definition of the sink is syntactically wrong at step 270.

As mentioned earlier with reference to FIG. 2, once the scalability check has been performed for each sink value in the table, or for a subset of the sink entries as determined by additional information provided, such as a waiver file, then an output report can be produced identifying any sinks considered to be non-scalable or syntactically wrong. If desired, further design iterations can then be performed in order to seek to remove any such scalability issues.

By way of example of how the process of FIG. 6 is used, let us consider each of the example entries within the table 160 of FIG. 5. Considering sink 1, the process will proceed through steps 200, 205, 210 and 215. Since the sink width is also parameterised, the process will proceed to step 225. At step 225 it will be determined that the driver formula and source formula (in this instance the source formula is in fact the source width indication "PARAM1+1") are defined in allowable terms, and accordingly a string match evaluation will be performed at step 230. At this point, it will be determined that the sink formula identifies the actual width as being PARAM1+1, whereas the driver formula expresses the expected width as being PARAM2+3. Here it is clear that the widths do not match for all possible values of PARAM1 and PARAM2, and accordingly it will be determined that the design is not scalable.

Similar conclusions will also be reached for example 3 in the table 160 of FIG. 5. However, for example 2, at step 225 of FIG. 6, the process will then proceed to step 280, and because the sink and driver formulae do not use the same parameters, it will be determined at step 290 that the sink is likely not scalable.

As a yet further example, consider the following:

assign sink4[2:0]=driver6[PARAM1:0]

Considering again the flow of FIG. 6, the process will proceed to step 215, but at that point will branch to step 220, where it will be determined that the sink is not scalable.

As mentioned earlier, when provided with an output report identifying the sink definitions that are considered to be non-scalable, it may be possible to modify the RTL design to seek to address such scalability issues. Considering equation 1 in FIG. 5, the scalability issue could be resolved by rewriting the same line of code as follows:

assign sink1[PARAM1:0]={(PARAM1−PARAM2) {1'b0}, driver1[PARAM2:0] };

When performing the string match evaluation at step 230 for this modified definition, it will again be determined that the sink formula indicates an actual width of the sink equal to PARAM1+1. However, for the driver formula, the width will be considered to be PARAM1−PARAM2+(PARAM2+1), and this reduces down to PARAM1+1, hence indicating that the driver formula and the sink formula are the same. Accordingly, at this point the widths will be determined to match at step 235 and the sink definition will be considered to be scalable at step 240.

Figure 7:
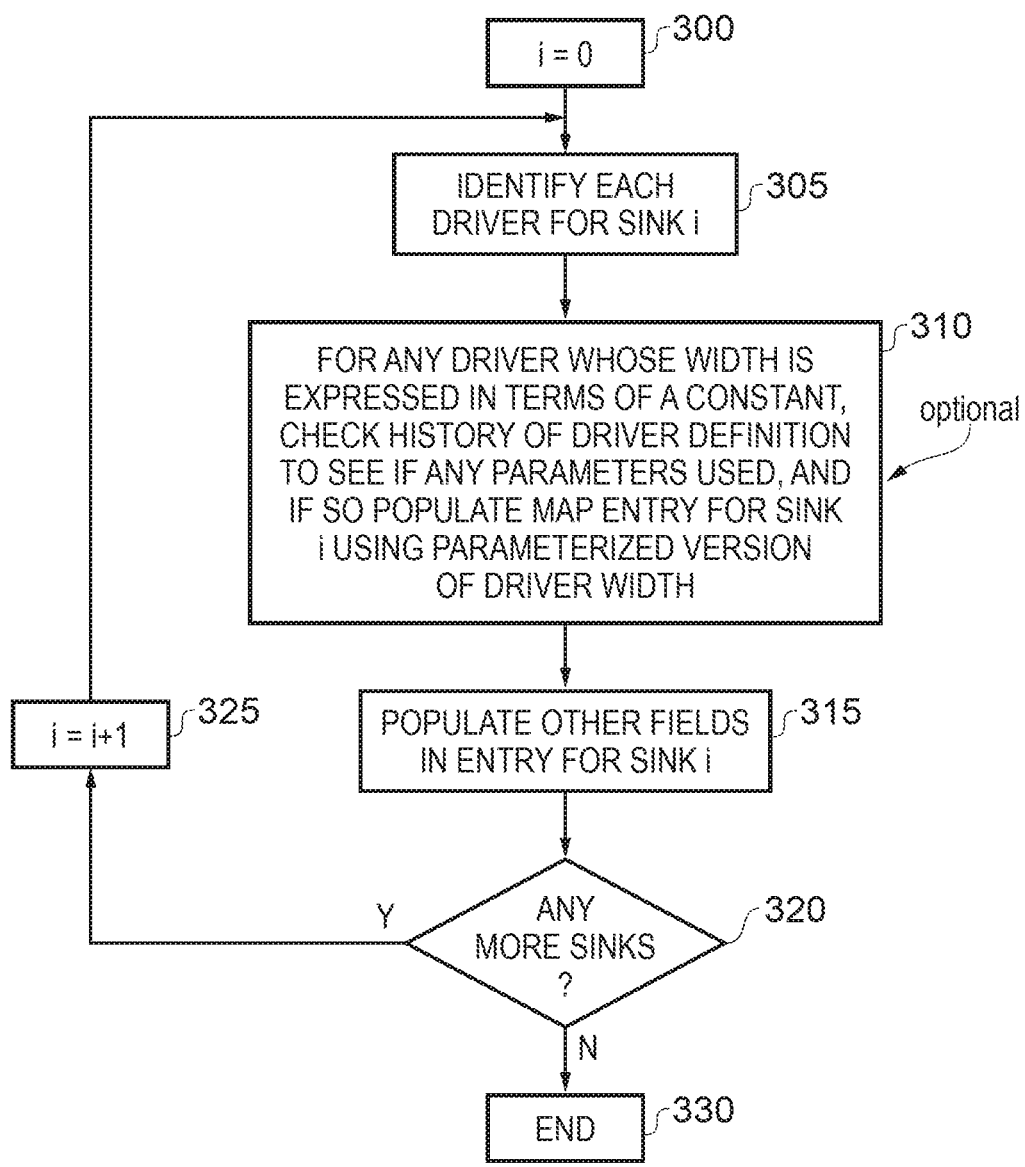
FIG. 7 is a flow diagram illustrating how the mapping table is prepared in accordance with one embodiment.

FIG. 7 is a flow diagram illustrating an optional additional step that can be performed when preparing the map table. At step 300, a variable "i" is set to zero, and then at step 305 each driver for sink i is determined by analysing the RTL representation. Then, optional step 310 is performed where, if a driver has its width expressed in terms of a constant, an additional check through the history of the driver definition within the RTL representation is performed in order to determine if any parameters were used earlier in the driver definition. If so, then when populating the map entry for sink i, the parameterised version of the driver width is used when populating the driver width information within the table.

At step 315, all the other fields in the entry for sink i are populated in the standard way, and at step 320 it is determined whether there are any more sinks within the RTL representation that require an entry to be made within the table. If so, the value of i is incremented at step 325, and the process returns to step 305. Once all of the required sinks have been considered, then the mapping table preparation process ends at step 330.

As an example as to how the optional step 310 can assist in identifying scalability issues, consider the following code:

wire [PARAM1:0] driver1;
assign sink1[10:0]=driver1[10:0];

The first line defines driver1 as a wire having a width PARAM1+1. However, when the sink "sink 1" is subsequently defined, it is defined in terms of a constant. In particular, the sink is defined as being 11 bits wide, and set equal to driver 1, which is also defined as being 11 bits wide. In principle, this definition of the sink causes no problems, since it is syntactically correct, and does not suffer from any scalability issues, since neither the sink nor its associated driver are defined in terms of parameters. However, by looking back through the RTL to the initial definition of driver 1, it is determined that driver 1 is in fact defined in terms of parameters. If the parameterised value is then used when populating the table for sink 1, then when the process of FIG. 6 is performed, the process will flow through steps 200, 205, 210 and 215, at which point because the sink width is not parameterised, it will be determined that the definition of the sink is not scalable at step 220. This may be useful, since if the scalability issue is not detected, then it may be possible during the later stages, for example at compilation, for PARAM1 to be given a value of less than 10, and in that case the line of code defining the sink is not valid as that line of code uses an out of range value for driver1.

In accordance with the above described embodiment, the process can be used to identify within the mapping table every sink defined within the RTL file, and then to perform a scalability check for every sink. However, it is possible that there may be some sections of code where the designer does not want the scalability check to be performed for various reasons, for example where the sink has a fixed width even though the driver might be defined using parameters. Considering the example in the preceding paragraph, if the designer never expects PARAM1 to have a value less than 10, and if he or she wants sink1 to have a fixed length of 11, then there may be no reason to perform the scalability check on the above line of code. To relax the scalability checks for such scenarios, in one embodiment it is possible for the designer to feed into the tool a waiver file in which he or she can identify the sinks to be omitted from the scalability check, for example in a Comma Separated Value (CSV) format. The sinks can be identified in a number of ways, but in one embodiment are identified using at least the line number of the relevant sinks. In one embodiment, a sink identifier can also be included as well as the line number within the waiver file.

Figure 8:
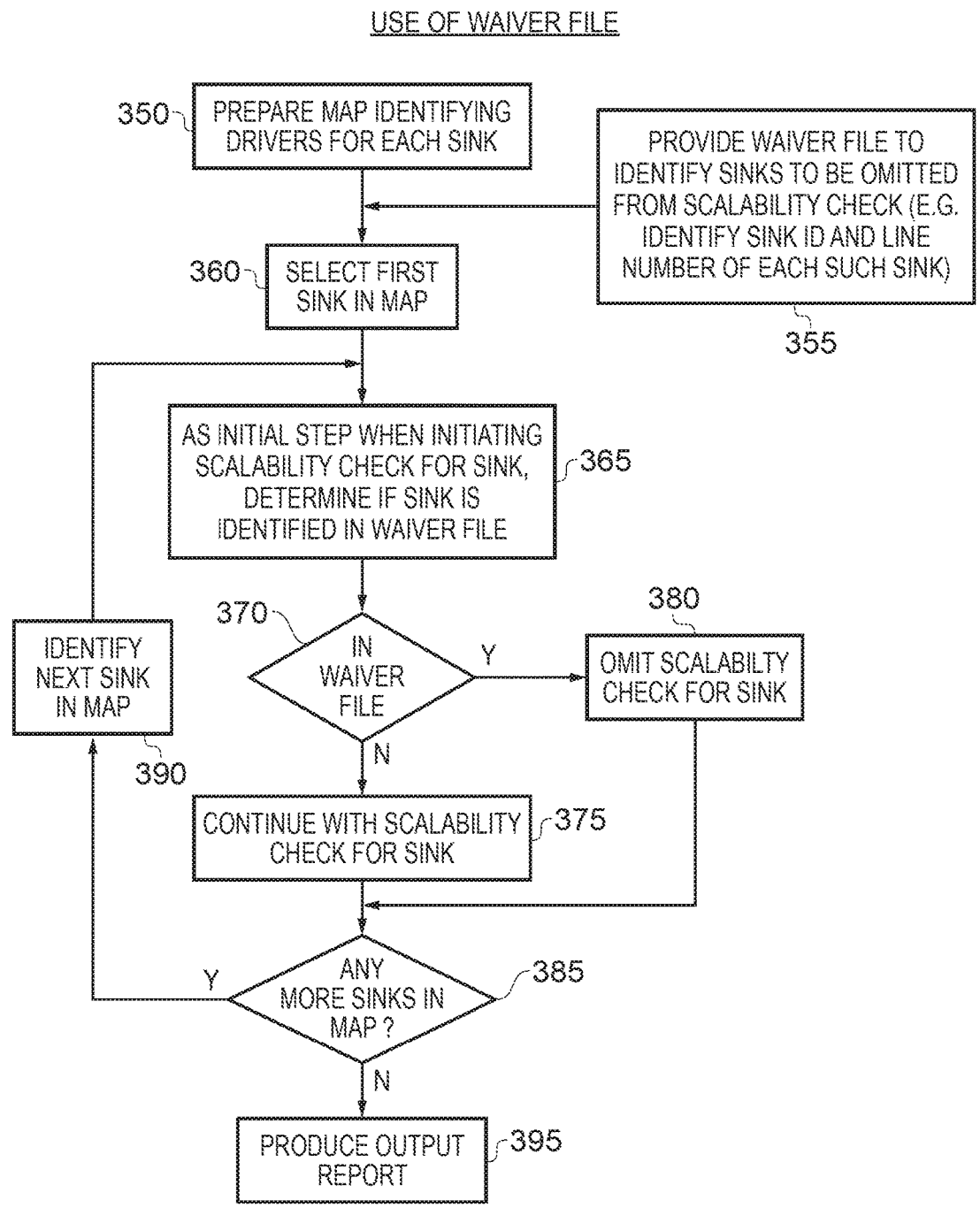
FIG. 8 is a flow diagram illustrating the use of a waiver file in accordance with one embodiment.

The way in which such a waiver file can be used in one embodiment is described in FIG. 8. At step 350, the mapping table is prepared identifying the drivers for each sink. Then, the waiver file may be provided, as indicated by step 355 to identify sinks to be omitted from the scalability check, for example by identifying the sink ID and the line number of each sink. In other embodiments, the waiver file may merely identify the line number, with the line number being sufficient to identify entries within the mapping table that should be omitted from the scalability check.

At step 360, the first sink in the mapping table is selected, and then at step 365, as an initial step when initiating the scalability check for the sink, it is determined if the sink is identified in the waiver file. As indicated by the decision box 370, if it is in the waiver file, then the scalability check for that sink is omitted at step 380, whereas otherwise, as indicated by step 375, the process continues with the scalability check for the sink. The process then proceeds to step 385, either from step 375 or step 380, where it is determined whether there are any more sinks in the mapping table. If so, then the next sink is identified at step 390, and the process returns to step 365. However, once all sinks within the mapping table have been considered, then the process proceeds to step 395, where the output report is produced identifying any sink definitions that have scalability issues.

Whilst in the embodiment illustrated in FIG. 8, the mapping table is prepared for each of the sinks within the RTL file and then the waiver file is used to omit the sinks identified in certain entries of the mapping table from the scalability check, in an alternative embodiment the waiver file may be used at an earlier stage, so that the mapping table is only populated with sinks that are not identified in the waiver file. Thereafter, the scalability check will then be performed for every entry identified within the mapping table.

It is possible that the designer will go through various iterations of the design of a circuit before reaching a final design to be used. It is known to use version control systems to keep track of changes between different versions of the RTL design. For example, a Git system can be used, Git being open source software for managing version control of computer files. Each version of the design can be committed to a Git repository, and then as each new version is developed, it is possible to compare that design with a version stored in the Git repository in order to identify where lines have been added, and where lines have been deleted, relative to the version held in the repository. In order to remove from the designer the responsibility to update the waiver file every time a line of code is added or deleted in a particular RTL file (as this will change the line numbers of the sinks specified in the waiver file), an algorithm has been developed which can use the information available from the version control software to automatically update the waiver file information. This process is illustrated schematically by the flow diagram of FIG. 9, for the example where the version control software is Git software.

At step 400, the original RTL design is committed to the Git repository. Thereafter, at step 410 the RTL design is modified, and following some modification a Git diff command is issued to cause the Git software to analyse the latest design with reference to the original version held in the Git repository in order to produce an output identifying the differences between the modified design and the original design. Accordingly, the output of the Git diff command is received at step 420, and then at step 430 the Git diff output is processed in order to update the waiver file. This process will be discussed in more detail later with reference to FIG. 10.

Once the waiver file has been updated, then the process can proceed to step 440 where a scalability check can be performed on the modified RTL design by preparing a map of sinks and drivers for the modified RTL design, and then performing the scalability check with reference to the updated waiver file. Since the updated waiver file will now correctly identify the line numbers within the modified RTL design for each of the sinks to be omitted from the scalability check process, the process of FIG. 8 can merely be re-performed for the modified RTL design, using the updated waiver file.

Figure 9:
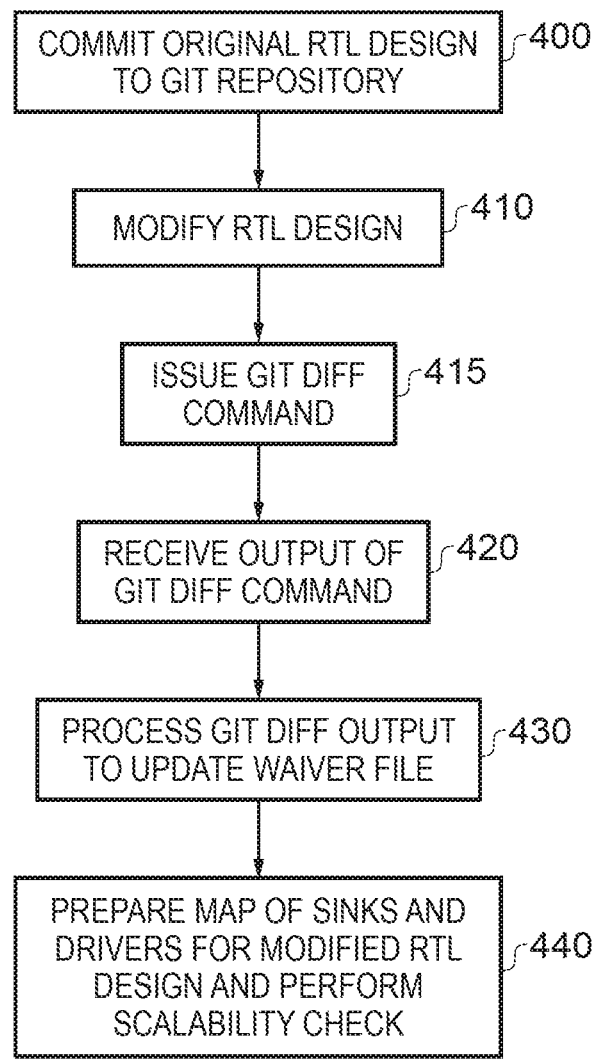
FIG. 9 illustrates how a modification in the circuit design may be used to trigger an update in the waiver file in accordance with one embodiment.
Figure 10:
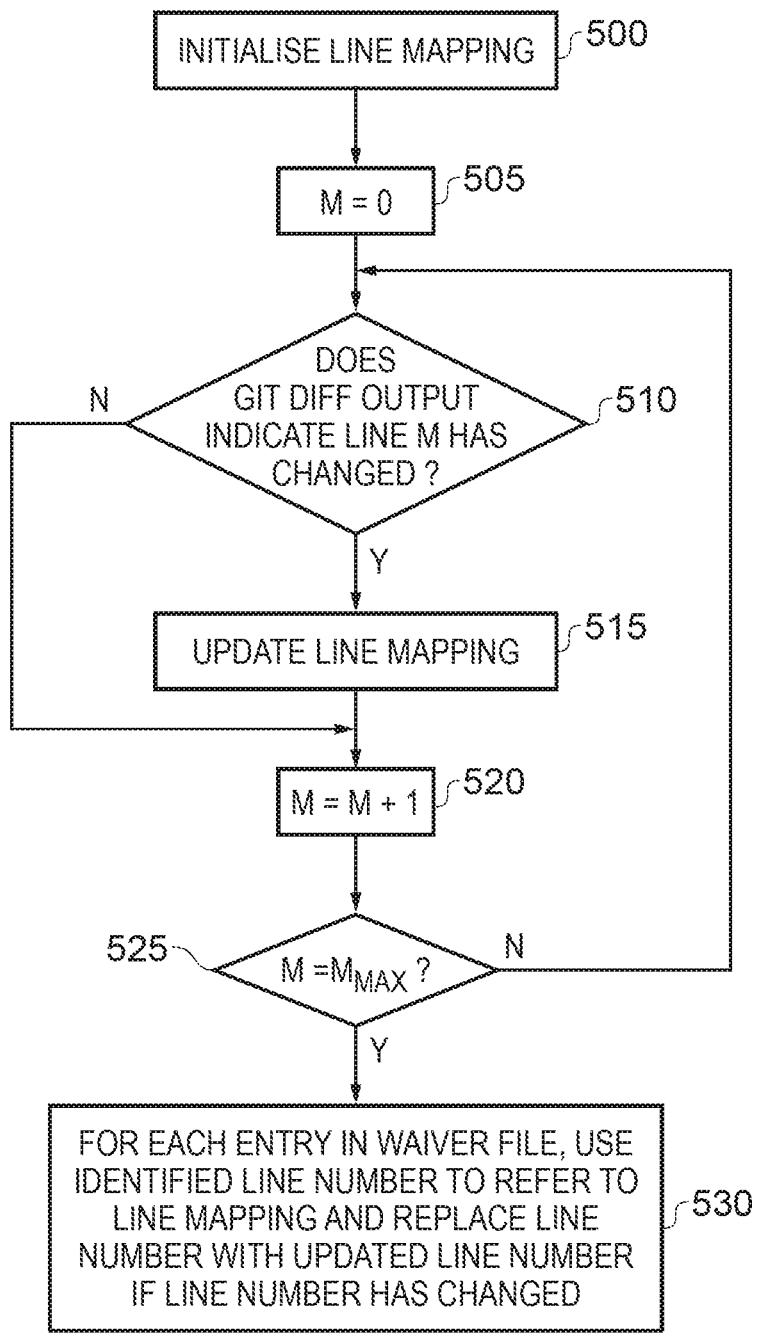
FIG. 10 is a flow diagram illustrating how the waiver file is updated in accordance with one embodiment.

FIG. 10 is a flow diagram illustrating the steps performed during step 430 of FIG. 9 in accordance with one embodiment. At step 500, a line mapping is initialised. For example, at the initialisation stage, each line number in the original RTL design will be mapped to the same line number within the line mapping. Thereafter, at step 505 a variable M is set equal to 0, and then at step 510 it is determined whether the Git diff output indicates that line M has changed. If it has, then at step 515 the line mapping is updated by indicating, for line M in the original RTL design, the corresponding line number in the modified RTL design.

Thereafter, at step 520 variable M is incremented, or is incremented directly following step 510, if the Git diff output indicates that line M has not changed.

Then, at step 525 it is determined whether variable M has reached a maximum value, indicating that all lines of code in the original RTL design have been considered. If not, the process returns to step 510. Once all of the lines of code within the original RTL design have been considered, and the line mapping updated accordingly based on the Gif diff output, then the process can proceed to step 530.

At step 530, for each sink entry in the waiver file, the identified line number for that sink is used to refer to the line mapping, such that the line number specified within the waiver file can be replaced with the updated line number indicated in the line mapping, if the line number has in fact changed. As a result, an updated waiver file is produced, which still correctly identifies by line number each of the sinks that need to be omitted from the scalability check process. The output of the Git diff command can take a variety of forms. However, in one embodiment, the generic format of Git diff command is as follows:

@@-<line number in old version of file>, <number of lines deleted in old version of file>+<line number in old version of file>,<number of lines added in new version of file>@@

An example of git diff command output for a file is:
@@-4,3+3,0 @@
@@-9,0+7,2 @@

This means that at line 4 of the old version of the file 3 lines were deleted, and no new lines were added starting at line 3 of the old version of the file. Similarly, at line 9 of the old version of the file no lines were deleted, and at line 7 of the old version of the file 2 lines were added.

Whilst the above example has been illustrated with reference to Git version control software, the algorithm can be generically extended and applied to various different types of version control software.

Figure 11:
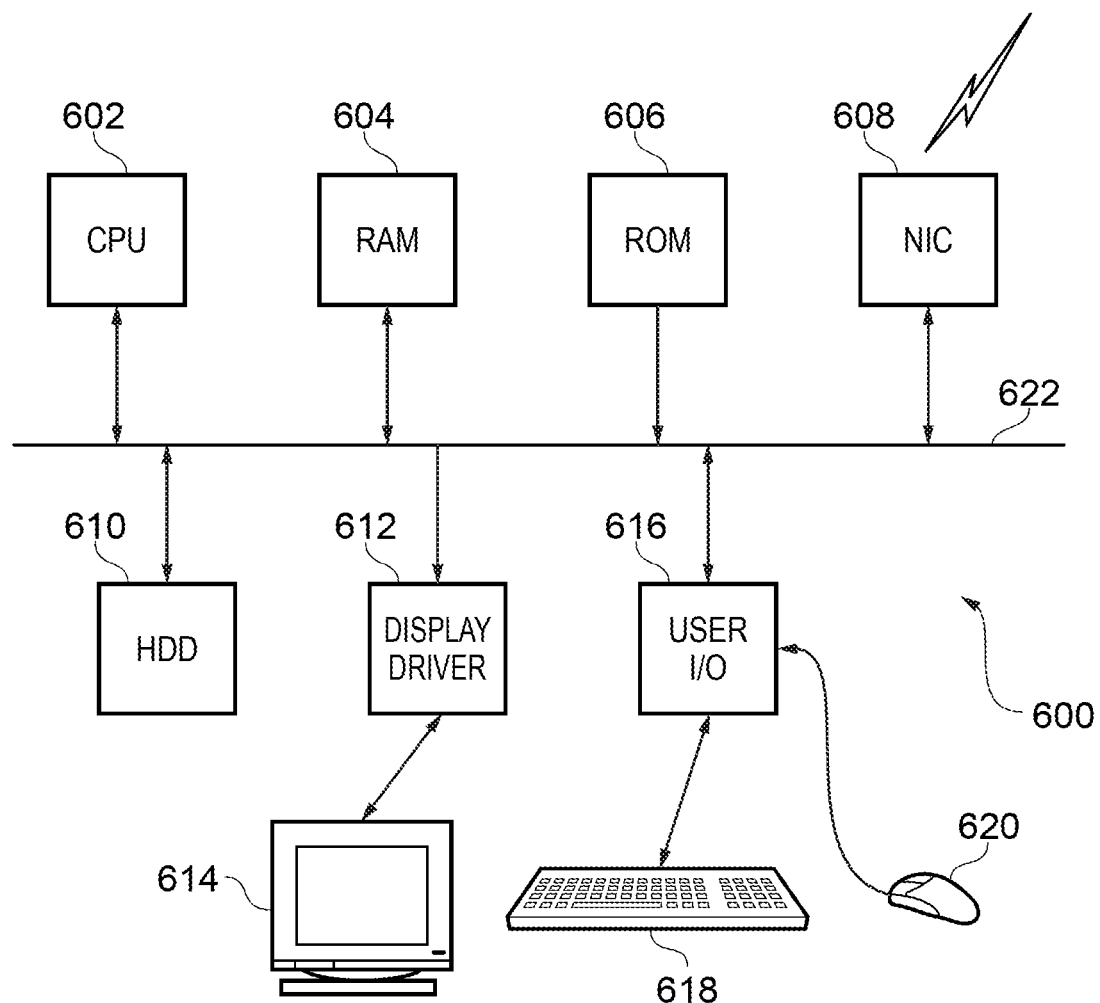
FIG. 11 is a diagram of a computer system on which software can be executed to perform a scalability check on an HDL representation of a circuit in accordance with one embodiment.

FIG. 11 schematically illustrates a general purpose computer 600 of the type that may be used to implement the above described scalability checks on an HDL representation of a hardware circuit, in accordance with one embodiment. The general purpose computer 600 includes a central processing unit 602, a random access memory 604, a read only memory 606, a network interface card 608, a hard disk drive 610, a display driver 612 and monitor 614 and a user input/output circuit 616 with a keyboard 618 and mouse 620 all connected via a common bus 622. In operation, the central processing unit 602 will execute computer program instructions that may be stored in one or more of the random access memory 604, the read only memory 606 and the hard disk 610 or dynamically downloaded via the network interface card 608. The results of the processing performed may be displayed to a user via the display driver 612 and the monitor 614. User inputs for controlling the operation of the general purpose computer 600 may be received via the user input/output circuit 616 from the keyboard 618 or the mouse 620. It will be appreciated that the computer program could be written in a variety of different computer languages. The computer program may be stored and distributed on a recording medium or dynamically downloaded to the general purpose computer 600. When operating under control of an appropriate computer program, the general purpose computer 600 can perform the above described scalability check operations in order to identify any scalability issues in an HDL representation of a digital circuit. The architecture of the general purpose computer 600 could vary considerably and FIG. 11 is only one example.

From the above described embodiments, it will be seen that such embodiments provide a particularly efficient and robust mechanism for verifying the scalability of a high-level design representation of a circuit. The scalability check can be automated and avoids the need to test all possible combinations of values that may be attributed to parameters within the design.

Prior to the technique of the described embodiments being developed, the ability to check scalability was relatively limited. For example, a few random configurations with different values of parameters could be tested using the validation environment as a very crude scalability sanity check. However, needless to say, such an approach only tests a very tiny fraction of the infinitely large design space, and hence provided no guarantee whatsoever that a customer would not run into issues if they were to use a different combination of parameter values than the ones that have been tested. However, the techniques of the described embodiments eliminates that impossible validation task, by enabling a scalability check to be performed without needing to attribute any values to the parameters within the design.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

I claim:

1. A computer implemented method of performing a scalability check on a Hardware Description Language (HDL) representation of a circuit, the HDL representation identifying a plurality of sink signals, where each sink signal is arranged to take a result value computed by performing an operation using as input one or more driver signals, the method comprising:
creating within a storage a mapping table to map driver signals to sink signals, each entry in the mapping table identifying one of the plurality of sink signals and each driver signal used in the computation of the result value for that sink signal;
for each entry of the mapping table, deriving from the HDL representation and storing within that entry a sink width indication of the sink signal, a driver width indication for each driver signal identified by that entry, and an operation type indication for the operation used to compute the result value for the sink signal;
executing on processing circuitry a scalability check operation for one or more selected entries in the mapping table that have at least one of the sink and driver width indications specified with reference to at least one parameter, for each selected entry the scalability check operation comprising:
determining, using the operation type indication and the driver width indication for each driver signal identified by the selected entry, a driver formula identifying an expected width for the sink signal;
determining, using the sink width indication, a sink formula to identify the width of the sink signal; and
performing an evaluation of the sink formula and the driver formula to determine whether the presence of said at least one parameter gives rise to a scalability issue; and
outputting a result file identifying each sink signal that has been detected to have a scalability issue.

2. A computer implemented method as claimed in claim 1, wherein when said at least one parameter is only present in one of the driver formula and the sink formula, said evaluation of the sink formula and the driver formula determines that a scalability issue exists.

3. A computer implemented method as claimed in claim 1, wherein when both the sink formula and the driver formula incorporate at least one of said at least one parameter, and a specified criteria is met, said evaluation comprises performing a string match evaluation of the sink formula and the driver formula to determine whether the sink formula and the driver formula match, and in the absence of the sink formula and the driver formula matching said evaluation determines that a scalability issue exists.

4. A computer implemented method as claimed in claim 3, wherein said specified criteria is that the driver formula and the sink formula comprise only one or more of addition, subtraction and multiplication operations.

5. A computer implemented method as claimed in claim 3, wherein in the absence of said specified criteria being met, said evaluation comprises determining whether either one of the driver formula and the sink formula use a parameter unused by the other one of the driver formula and the sink formula, and in that event to determine that a scalability issue exists.

6. A computer implemented method as claimed in claim 1, wherein the step of creating the mapping table comprises populating an entry of the mapping table for each sink of said plurality of sinks.

7. A computer implemented method as claimed in claim 1, wherein the scalability check operation is performed for every entry in said mapping table.

8. A computer implemented method as claimed in claim 1, further comprising performing the scalability check operation for at least one selected entry where none of the sink and driver width indications are specified with reference to at least one parameter, wherein:
the determining of the driver formula produces an expected width value;
the determining of the sink formula produces an actual width value;
the evaluation of the sink formula and the driver formula detects whether the expected width value matches the actual width determined from the sink formula, with a syntactic error being detected when the expected width value and the actual width value differ.

9. A computer implemented method as claimed in claim 1, wherein:
when deriving from the HDL representation the driver width indication for a driver signal of an associated sink signal, when a width of said driver signal is identified as a constant when linked to the associated sink signal within the HDL representation, the deriving step comprises reviewing the HDL representation to determine whether an earlier definition of that driver signal expresses the width in terms of at least one parameter, and in that event to produce for storage in the associated entry of the mapping table the driver width indication in terms of said at least one parameter.

10. A computer implemented method as claimed in claim 1, further comprising:
receiving via an input interface a waiver file identifying sink signals to be omitted from the scalability check operation; and
when executing on the processing circuitry a scalability check operation for one or more selected entries in the mapping table, the one or more selected entries are chosen so as to exclude any sink signal identified by the waiver file.

11. A computer implemented method as claimed in claim 10, wherein the waiver file identifies the sink signals to be omitted by reference to a line number of each such sink signal within the HDL representation, and the mapping table includes for each entry an indication of the line number of the associated sink signal, such that a determination to omit from the scalability check operation a sink signal identified in an entry of the mapping table is determined by comparison of the line number indication stored in that entry with the line numbers identified in the waiver file.

12. A computer implemented method as claimed in claim 11, wherein:
version control software is used to record changes made between a current HDL representation of the circuit and a previous HDL representation of the circuit so as to enable line numbers in the previous HDL representation to be mapped to line numbers in the current HDL representation;

when the waiver file is specified for said previous HDL representation, the method further comprises, prior to creating the mapping table and performing the scalability check operation in respect of the current HDL representation:

obtaining an output from the version control software indicative of the changes made between the current HDL representation and the previous HDL representation; and updating the waiver file with reference to said output, so as to update the line number references within the waiver file to identify the line number within the current HDL representation for each sink signal to be omitted from the scalability check operation.

13. A computer implemented method as claimed in claim 12, wherein:

the obtaining of said output comprises issuing a git diff command to the version control software, and the output comprises a file identifying where lines have been deleted from the previous HDL representation and where lines have been added to the previous HDL representation.

14. A computer implemented method as claimed in claim 12, wherein the updating of the waiver file comprises analysing the output from the version control software to create a remapping table mapping line numbers in the previous HDL representation to line numbers in the current HDL representation, and for each entry in the waiver file updating the line number information using the remapping table.

15. A computer implemented method as claimed in claim 1, wherein the scalability check operation is performed on the HDL representation prior to the HDL representation being subjected to a compilation operation.

16. A computer implemented method as claimed in claim 1, wherein the HDL representation represents the circuit at a Register Transfer Level (RTL) of abstraction.

17. An apparatus comprising:

processing circuitry to perform data processing operations; and storage to store data manipulated by the processing circuitry when performing the data processing operations;

the apparatus being configured to execute a computer implemented method of performing a scalability check on a Hardware Description Language (HDL) representation of a circuit, as claimed in claim 1.

18. A computer program stored in a non-transitory, computer-readable storage medium comprising program instructions which, when executed on a computer, causes the computer to implement a method of performing a scalability check on a Hardware Description Language (HDL) representation of a circuit, as claimed in claim 1.

* * * * *